United States Patent [19]

Brian et al.

[11] Patent Number: 4,831,965

[45] Date of Patent: May 23, 1989

[54] FABRICATION OF SOLID OXIDE FUEL CELL BY ELECTROCHEMICAL VAPOR DEPOSITION

[75] Inventors: Riley Brian, Willimantic; Bernard E. Szreders, Oakdale, both of Conn.

[73] Assignee: The United States of America as represented by the United States Department of Energy, Washington, D.C.

[21] Appl. No.: 184,476

[22] Filed: Apr. 21, 1988

[51] Int. Cl.$^4$ ............................................. C23C 16/00
[52] U.S. Cl. .................................... 118/725; 118/715
[58] Field of Search ............................... 118/715, 725

[56] References Cited

U.S. PATENT DOCUMENTS

| | | | |
|---|---|---|---|
| 4,374,184 | 2/1983 | Somers et al. | 429/31 |
| 4,395,468 | 7/1983 | Isenberg | 429/31 |
| 4,486,400 | 12/1984 | Riley | 423/592 |
| 4,490,444 | 12/1984 | Isenberg | 429/31 |
| 4,550,066 | 10/1985 | Alexander et al. | 429/191 |
| 4,567,013 | 1/1986 | Riley | 423/593 |

OTHER PUBLICATIONS

Zymboly, "Vapor Dep. of Zirconium Oxide Electrolyte and Lanthanum Chromite Interconnection for Multi-Cell Fabrication", BNL 51728, Aug. 1983.
Isenberg, "Growth of Refractory Oxide Layers By Electrochemical Vapor Dep. (EVD) at Elevated Temps.", Proc. of Symp. on Electrode Material and Processes for Energy Conversion and Storage, ECS, proceedings vol. 77-6, 1977.
Merrigan et al., "High Temp. Heat Pipes for Waste Heat Recovery", AIAA 15th Thermophysics Conf., July 1980.
Lundberg, "Silicon Carbide-Tungsten Heat Pipes for High-Temp. Service", Ind. Eng. Chem. Prod. Res. Dev., 1980, No. 19, pp. 241-244.
Brule and Miller, "Performance Characteristics of Li/V$_6$O$_{13+y}$ Cells in a Sulfolane Electrolyte", SAE Technical Paper, Series 1985.
Alexander and Riley, "The CuI-ZnI$_2$ System", Part 1: "Synthesis and Ionic Conductivity", Mat. Res. Bull., vol. 19, pp. 1527-1534, 1984.

*Primary Examiner*—Richard Bueker
*Attorney, Agent, or Firm*—Hugh W. Glenn; Robert J. Fisher; Judson R. Hightower

[57] ABSTRACT

In a high temperature solid oxide fuel cell (SOFC), the deposition of an impervious high density thin layer of electrically conductive interconnector material, such as magnesium doped lanthanum chromite, and of an electrolyte material, such as yttria stabilized zirconia, onto a porous support/air electrode substrate surface is carried out at high temperatures (approximately 1100°-1300° C.) by a process of electrochemical vapor deposition. In this process, the mixed chlorides of the specific metals involved react in the gaseous state with water vapor resulting in the deposit of an impervious thin oxide layer on the support tube/air electrode substrate of between 20-50 microns in thickness. An internal heater, such as a heat pipe, is placed within the support tube/air electrode substrate and induces a uniform temperature profile therein so as to afford precise and uniform oxide deposition kinetics in an arrangement which is particularly adapted for large scale, commercial fabrication of SOFCs.

24 Claims, 4 Drawing Sheets

FABRICATION OF SOLID OXIDE FUEL CELL BY ELECTROCHEMICAL VAPOR DEPOSITION

CONTRACTUAL ORIGIN OF THE INVENTION

The United States government has rights in this invention pursuant to Subcontract No. 51232401 under Prime Contract No. W-31-109-ENG-38 among the U.S. Department of Energy, the University of Chicago and Combustion Engineering, Inc., of Stamford, Conn.

BACKGROUND OF THE INVENTION

This invention relates generally to power generating fuel cells and is particularly directed to the fabrication of solid oxide fuel cells.

There are several types of fuel cells currently being studied as possible alternatives for converting coal derived fuels to electricity. The three primary types of fuel cells under study are the phosphoric acid (PAFC), molten carbonate (MCFC), and solid oxide fuel cell (SOFC). The most important single factor in assessing the viability of an alternative power generating concept is its overall capital and operational cost to the user compared to the cost of conventional power generating systems. A number of factors affecting the economics of power generation based upon the fuel cell need to be considered in evaluating the commercial viability of a given fuel cell approach. One of the primary factors to be considered is the capital cost of the power generating unit of the system. The present invention is directed to the fabrication of a low cost SOFC.

The modular SOFC system is considered to be one of the viable technologies for future commercial installations. In its simplest form, an SOFC modular system is comprised of an array of ceramic based fuel cell tubes connected in series and further includes parallel configurations having the necessary fuel and air manifolds, plenum exhaust outlets, electrical interconnects, etc. All such fuel cells further include cathode, electrolyte and anode layers which are deposited upon a porous support tube with an interconnecting strip to form series and parallel electrical connections.

Such cells or stacks of cells operate at high temperatures to directly convert chemical energy of a fuel into direct current electrical energy by electrochemical combustion. This type of fuel cell utilizes a natural or synthetic fuel gas such as those containing hydrogen, carbon monoxide, methane and an oxidant such as oxygen or air. A typical SOFC reacts hydrogen fuel with oxygen from air to produce electrical energy, water vapor and heat. Cell operating temperatures are typically in the range of from 700° to 1100° C. Each cell contains an electrolyte in solid form which serves to insulate the cathode and anode from one another with respect to electron flow, but permits oxygen ions to flow from the cathode to the anode. The hydrogen reaction on the anode with oxide ions generates water with the release of electrons; and the oxygen reaction on the cathode with the electrons effectively forms the oxide ions. Electrons flow from the anode through an appropriate external load to the cathode, and the circuit is closed internally by the transport of oxide ions through the electrolyte. A selected radial segment of the cathode, or air electrode, is covered by an interconnect material, or interconnector, for forming the aforementioned series and parallel electrical connections with adjacent SOFCs.

Present methods of fabricating SOFCs contemplate the use of chemical vapor deposition (CFD) and electrochemical vapor deposition (EDV) for depositing the electrolyte material as well as the interconnector material on an SOFC support tube which is porous and preferably comprised of calcia stabilized zirconia. This process is carried out by an SOF fabrication apparatus 10 such as illustrated in FIG. 1. The SOFC fabrication apparatus 10 includes a base 12, to an upper portion of which is attached in a sealed manner a cylindrical reactor tube 14. The base 12 includes a manifold 26. High temperature water vapors such as in the form of a water/hydrogen gas mixture are directed through a duct 20 within the base 12 to permit the water vapors to flow upward through the manifold 26. An upper portion of the manifold 26 includes a plurality of spaced ducts 28 which direct the water vapors upward. Disposed about each of the ducts 28 is a generally cylindrical support member 16 preferably comprised of alumina. At the upper end of each of the support members 16 is attached an SOFC support tube, or porous air electrode substrate, 18. The water vapor is directed over the inner surface of each of the SOFC support tubes 18 and exits the tube fabrication apparatus 10 via an exhaust port 24. Chloride vapors 22 are introduced into an upper portion of the reactor tube 14 and are directed downward over the outer surface of each of the support tubes 18. The chloride vapors also exit the tube fabrication apparatus 10 via the exhaust port 24. A portion of the downward directed vapors are electrochemically deposited on the outer surface of the support tube 18 to form the oxidized interconnector and electrolyte layers. The reactor tube 14 is comprised of mullite and is heated externally by a plurality of resistance heaters 30 such as silicon carbide glowbars.

The electrochemical vapor deposition of the SOFC's interconnector is carried out at approximately 1300° C., while the electrochemical vapor deposition of the SOFC's electrolyte is carried out at approximately 1200° C. The $H_2O/H_2$ gas mixture is passed up the center of the pre-air electrode coated support tubes 18, and reacts at the outer surface of these tubes with metal chloride gas in a partial vacuum to produce an impervious oxide layer. Because both the interconnector and the electrolyte layers of the SOFC tube are not fully circumferential, $Cr_2O_3$ powder masking is necessary to blank off areas not requiring coating.

To extend the present SOFC tube fabrication apparatus which is capable of fabricating 12 SOFC support tubes per reaction to a 1000 support tube capability per reaction, which is believed to be necessary for the commercial viability of this approach, would require at least a 3 foot diameter mullite reactor tube heated externally by an array of heating elements in a design and at a power level, the feasibility of which is yet to be shown. Moreover, the capability of fabricating a 3 foot diameter, 8-10 foot long mullite reactor tube has also yet to be demonstrated and is of questionable feasibility from a commercial standpoint. Finally, external radiant heating of the SOFC support tubes is not only inefficient and costly, but gives rise to nonuniform heating of the SOFC support tubes resulting in the nonuniform and irregular deposition of air electrode and electrolyte layers thereon.

Use of the SOFC tube fabrication apparatus 10 of FIG. 1 requires the following sequential steps:
(1) EXTRUSION OF SUPPORT TUBE
(2) SINTERING OF SUPPORT TUBE (3) SLURRY COATING OF THE AIR ELECTRODE
(4) SINTERING OF AIR ELECTRODE
(5) INTERCONNECTOR MASK
(6) ELECTROCHEMICAL-VAPOR DEPOSITION OF THE INTERCONNECTOR
(7) DEMASKING OF THE INTERCONNECTOR MASK
(8) ELECTROLYTE MASK
(9) ELECTROCHEMICAL-VAPOR DEPOSITION OF THE ELECTROLYTE
(10) FUEL ELECTRODE MASK
(11) SLURRY COATING OF THE FUEL ELECTRODE
(12) SINTERING OF FUEL ELECTRODE The prior art approach to SOFC fabrication therefore involves a double EVD coating process wherein first the interconnector and then the electrolyte is deposited upon the support tube. This double EVD coating process is difficult to carry out, has not yet been proven in the large scale, commercial fabrication of SOFCs, and is time consuming and thus expensive.

The present invention addresses and overcomes the aforementioned limitations of the prior art by providing for the low cost, efficient and fast deposition of uniform interconnect and electrolyte layers on the porous support tube of an SOFC. The process and apparatus of the present invention are readily adapted to simultaneous processing of large numbers of SOFC support tubes using currently available technology so as to substantially enhance the commercial attractiveness of SOFCs as power generators.

OBJECTS AND SUMMARY OF THE INVENTION

Accordingly, it is an object of the present invention to provide an improved apparatus and method for fabricating solid oxide fuel cells (SOFCs).

It is another object of the present invention to provide an improved method and apparatus for depositing various conductive layers on the support tube/air electrode substrate surface of an SOFC.

Yet another object of the present invention is to substantially simplify and reduce the cost of fabricating SOFC tubes while ensuring the production of high quality, uniform multiconductive layered cell components.

A further object of the present invention is to deposit a thin impervious oxide layer of uniform thickness and conductivity on an SOFC support tube/air electrode structure so as to form the cell's interconnector and electrolyte elements.

A still further object of the present invention is to provide an apparatus and method which make use of electrochemical vapor deposition in the large scale, commercial production of SOFCs.

This invention contemplates apparatus for coating an outer surface of a porous SOFC tube having open and closed ends with an interconnector layer and an electrolyte layer. The apparatus comprises first means such as an open ended conduit for directing an oxidant gas into and along the length of the SOFC tube via the open end thereof, heating means which may be in the form of a heat pipe or hair-pin heater disposed within and along the length of the SOFC tube for uniformly heating the SOFC tube to a high temperature along its entire length, and second means for sequentially directing an interconnector gas and an electrolyte gas over an outer surface of the SOFC tube whereupon the interconnector and electrolyte gases become oxidized by the oxidant gas in forming solid, impervious interconnector and electrolyte layers on the outer surface of the SOFC tube.

BRIEF DESCRIPTION OF DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 2:
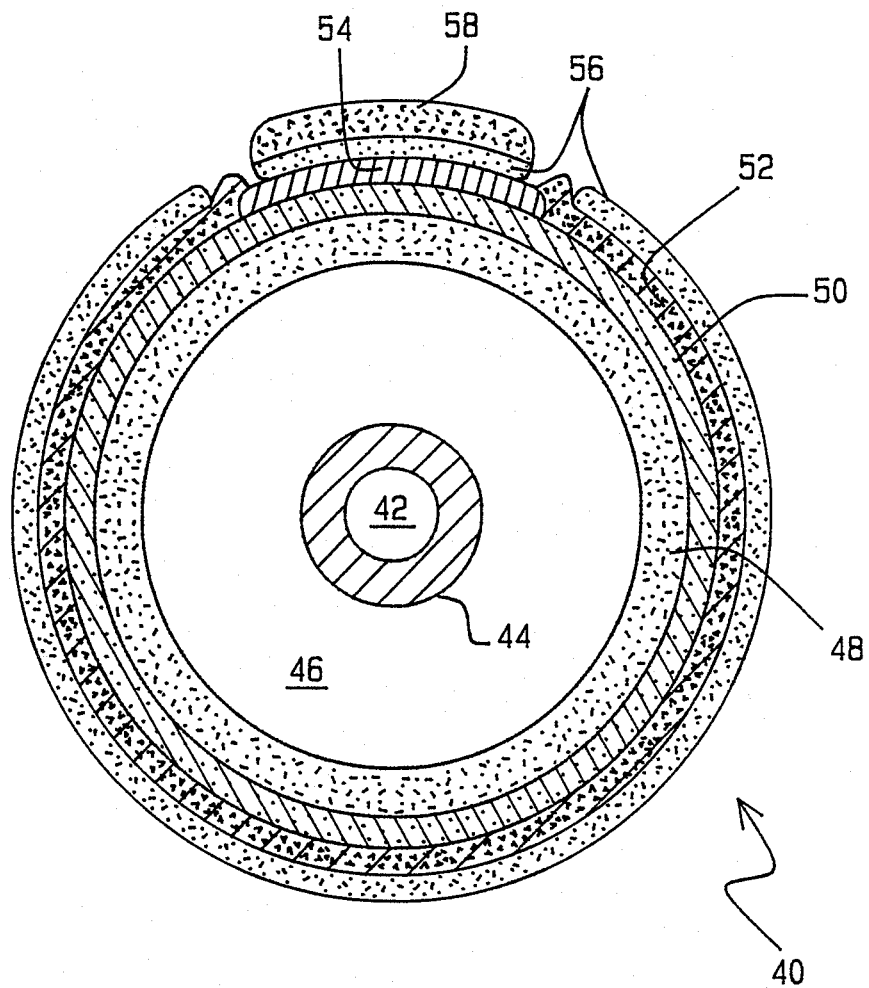
FIG. 2 is a sectional view of an SOFC tube which the present invention is particularly adapted to fabricate.

Referring to FIG. 2, there is shown a simplified sectional view of an SOFC tube 40 which the present invention is particularly adapted to fabricate. The SOFC tube 40 includes in its center an air inlet 42 defined by an air jet tube 44. A cylindrical air outlet 46 defined by a support tube 48 is disposed about the air jet tube 44. The support tube 48 is preferably comprised of calcia stabilized zirconia which is porous, while the air jet tube 44 is preferably comprised of stainless steel.

The support tube 48 is provided with three outer layers deposited thereon and it is this portion of the SOFC tube with which the present invention is concerned. The first outer layer deposited upon the support tube 48 is that of an air electrode 50 which extends around the entire circumference of the support tube. The air electrode 50 is preferably comprised of a strontium doped lanthanum manganite-zirconia mixture. The next outer layer is an electrolyte 52 disposed upon the air electrode 50 and extending substantially around the entire circumference thereof, e.g., on the order of 320°. The final layer is that of a fuel electrode 56 which includes two separate sections. A first section of the feel electrode 56 is disposed upon the electrolyte 52 and extends around a substantial portion thereof, while a second section of the fuel electrode is disposed upon an interconnector 54 positioned upon that portion of the air electrode 50 upon which the electrolyte is not positioned. An interconnector pad 58 is positioned on the second section of the fuel electrode over the interconnector 54. The interconnector 54 is a strip preferably comprised of magnesium doped lanthanum chromite which connects with the air electrode 50 and brings the cathode current to the surface where connections can be made between SOFC tubes. The electrolyte 52 is a thin impervious coating of yttria stabilized zirconia through which oxygen ions generated at the cathode diffuse and subsequently interract with hydrogen gas at the anode interface to form water as a by-product. The electrolyte layer 52 together with the interconnector 54 forms a sealed envelope to prevent molecular oxygen from diffusing through the layers to chemically react with the molecular hydrogen, thereby avoiding a chemical short and lowering cell efficiency.

A plurality of SOFC tubes 40 are arranged in a matrix to form energy generating modules which operate at approximately 1000° C. The individual SOFC tubes are in the form of thin walled cylinders on the order of ½ inch in diameter and 2 to 3 feet in length. Fuel and oxidant must be physically separated to prevent chemical reaction or burning and to thus promote the electrochemical reaction essential for the production of electric current. In order to provide separation of the fuel and oxidant, the electrolyte 52 as well as the interconnector 54 are impervious materials. The function of the interconnector 54 is to create a passage for the anode current to reach the surface of the SOFC tube 40 for making connections via bus bars (not shown) to the exterior of a generator module comprised of a plurality of closely spaced, abutting, parallel SOFC tubes. The yttria stabilized zirconia electrolyte 52 is a solid oxygen ion conductor which provides the right ionic environment for the SOFC's electrochemical reaction to take place. The gas sealing envelope comprising electrolyte 52, which extends approximately 320°, and the interconnector 54, which extends approximately 40°, prevents the chemical burning reaction of the fuel and oxygen from taking place through the porous substrates and electrodes. The structural integrity of the gas sealing envelope and the intrinsic compositional structure of the electrolyte 52 and the interconnector 54 provide essential functions for efficient operation of the cell.

The present invention is directed to a method and apparatus for the deposition of the interconnector 54 and electrolyte 52 on the SOFC's support tube 48 while the support tube is heated inside a gas/vacuum envelope at approximately 1300° C. This procedure ensures that the SOFC support tube 48 is uniformly heated resulting in uniform deposition of the interconnector 54 and electrolyte 52 in precisely controllable thicknesses. The individual SOFC tubes are internally heated by means of a heat pipe, a hair-pin resistance heater, or virtually any high temperature heater capable of being positioned within the SOFC tube 40. By internally heating the individual SOFC tubes, "a cold wall" evacuable furnace with refractory insulation and/or radiation shields which is easily fabricated and makes use of readily available materials and components can be used in carrying out the electrochemical vapor deposition process.

The electrolyte and interconnector layers of the SOFC tube are comprised of impervious high density ceramic oxides of mixed composition. The manner and mechanism by which these SOFC tube components are deposited upon the SOFC support tube depends directly on precise control of the temperature and partial pressures of the reacting species. The reacting species are typically the chlorides of magnesium, chromium and lanthanum for the interconnector, and yttrium and zirconium for the electrolyte. The electrochemical vapor deposition mechanism is described by the following three chemical reaction equations:

$$MeCl_2 + H_2O \rightarrow MeO + 2HCl \quad (1)$$

$$MeCl_2 + O^= \rightarrow MeO + Cl_2 + 2e^- \quad (2)$$

$$H_2O + 2e^- \rightarrow H_2 + O^= \quad (3)$$

The use of an internal heater in accordance with the present invention provides improved electrochemical vapor deposition of the electrolyte and interconnector layers because of the intrinsically uniform constant temperature zone applied to the SOFC support tube. The heat pipe approach makes use of a close ended tube having an internal capillary wick which is evacuated and then charged with a small amount of refrigerant prior to being permanently sealed. Thermal energy applied to either end of the heat pipe causes the refrigerant therein to vaporize. The higher vapor pressure within the heat pipe forces the refrigerant vapor toward the opposite end of the pipe. Thermal energy is then transferred to the cooler end of the heat pipe, causing the refrigerant vapor to condense into a liquid again and to give up its latent heat of condensation. The condensed refrigerant liquid then goes back to the hot end of the heat pipe to be reused. The cycle of condensation/evaporation can be carried out continuously so long as there is a temperature differential between the two ends of the heat pipe.

Figure 1:
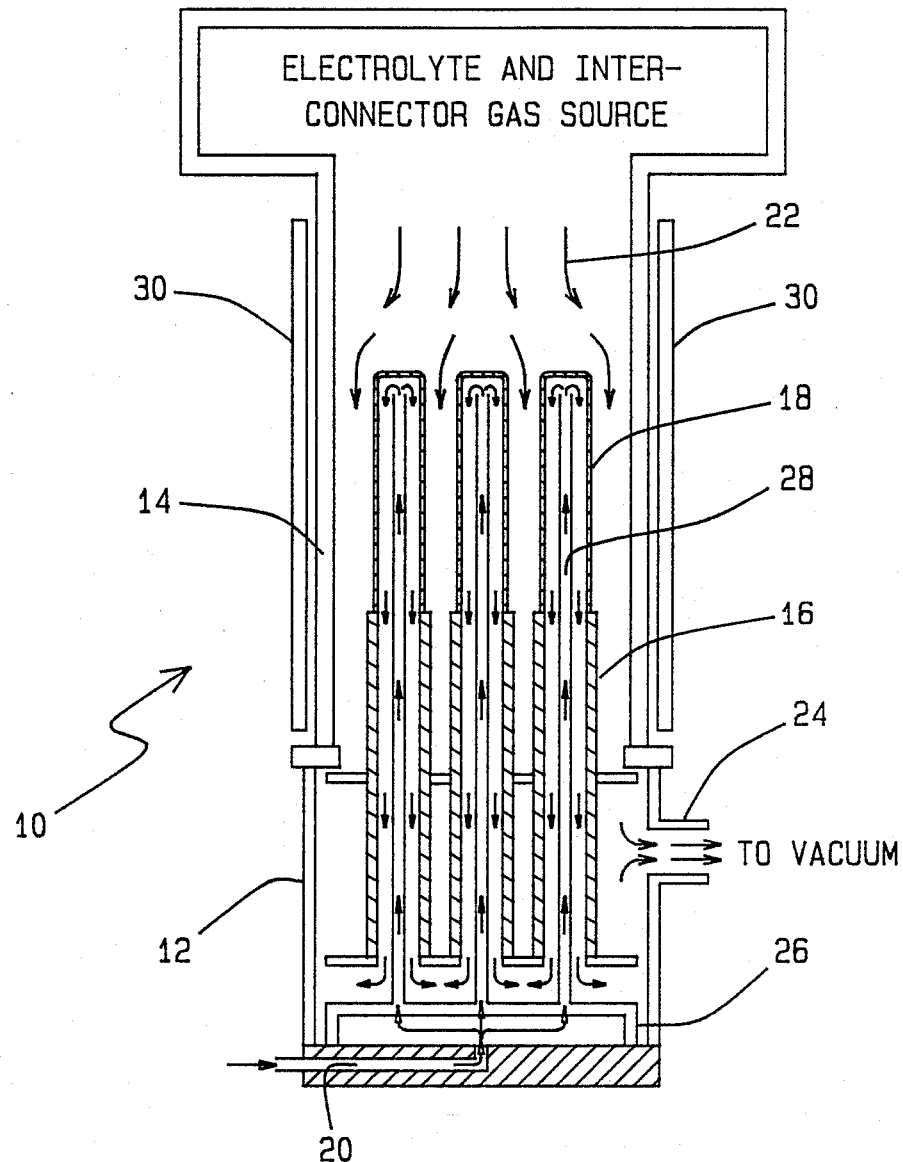
FIG. 1 is a simplified schematic diagram of a prior art solid oxide fuel cell (SOFC) tube fabrication apparatus.

The capillary wick within the heat pipe serves two functions. It distributes the liquid around the heat pipe's inner circumference at the evaporator section, i.e., the thermal input end of the heat pipe, to provide a completely wetted surface for maximum heat transfer. At the condenser section, i.e., the thermal output end of the heat pipe, the capillary wick provides a drainage path for the refrigerant liquid condensate so that it does not block the flow of vapor toward the thermal output end of the pipe. The temperature of the SOFC support tube, shown as element 18 within the prior art arrangement of FIG. 1, is controlled precisely by the temperature of the working fluid within the heat pipe and can be maintained at both the interconnector (1300° C.) and the electrolyte (1200° C.) deposition temperatures. The working fluid within the heat pipe is preferably comprised of mercury or lithium.

Figures 3, 4:
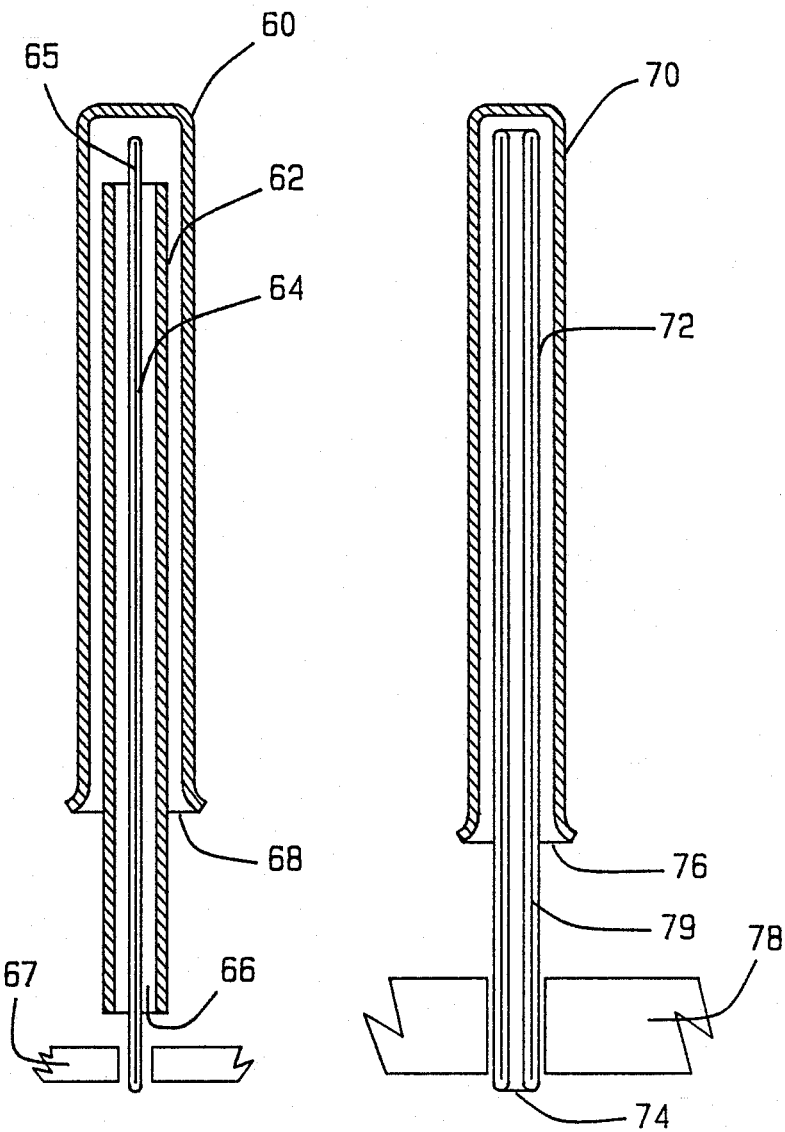
FIG. 3 is a simplified sectional view of an SOFC tube fabrication arrangement using a rod-type heat pipe in accordance with the present invention.
FIG. 4 is a simplified sectional view of an arrangement for fabricating an SOFC tube using a tube-type heat pipe in accordance with the present invention.
Figure 5:
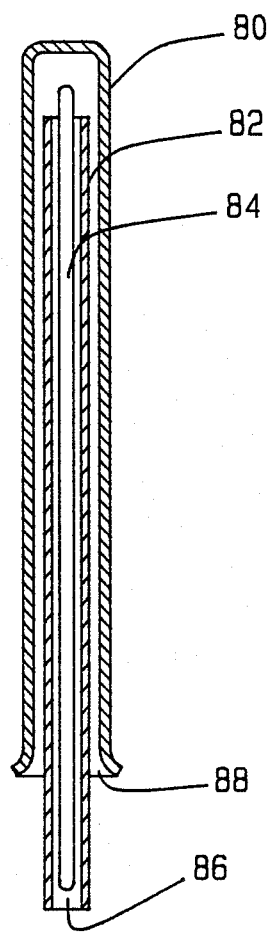
FIG. 5 is a simplified sectional view of an arrangement for fabricating an SOFC tube using a hair-pin heater in accordance with the present invention.

Referring to FIGS. 3, 4 and 5, there are shown sectional views of various embodiments of apparatus for fabricating an SOFC by electrochemical vapor deposition in accordance with the principles of the present invention. Referring to FIG. 3, there is shown a rod-like heat pipe 64 disposed within an SOFC support tube, or substrate, 60. The support tube 60 shown in FIG. 3 as well as those illustrated in FIGS. 4 and 5 and discussed below is mounted in the same position and in the same manner as the support tubes 18 within the SOFC tube fabrication apparatus 10 illustrated in FIG. 1. Thus, a flow of chloride vapors is directed over the SOFC support tubes from top to bottom as shown in FIGS. 3-5. The present invention is directed to a heating element disposed within each of the support tubes to provide uniform heating of the support tube for improved deposition of the interconnector layer comprised of chlorides of magnesium, chromium and lanthanum and the electrolyte layer comprised of yttrium and zirconium. As shown in FIG. 3, a closed rod-type heat pipe 64 having a refrigerant therein and containing an internal capillary wick 65 disposed along the length thereof is positioned within the support tube 60. A heat source 67 is positioned adjacent to a lower end of the heat pipe 64 and effects the vaporization of the refrigerant therein. A thin tube or conduit 62 preferably comprised of alumina is disposed between the heat pipe 64 and the support tube 60. The lower, open end of the thin tube 62 serves as a gas inlet 66, while the lower end of the support tube 60 functions as a gas outlet 68 allowing the water vapor to flow out of the support tube. The gas which flows into the lower end of the thin tube 62 and out of the lower end of the support tube 60 is an oxidant gas such as air or water vapor.

Referring to FIG. 4, there is shown a simplified sectional view of another embodiment of the present invention which makes use of a tube-type heat pipe 72 disposed within the SOFC support tube 70. The tube-type heat pipe 72 makes use of a cylindrical shaped capillary wick 79 disposed therein. The tube-type heat pipe 72 is open at its upper and lower ends, with its lower end forming an oxidant gas inlet 74, where the oxidant gas is typically comprised of a $H_2O/H_2$ mixture. The lower end of the support tube 70 serves as an oxidant gas outlet 76. A heat source 78 positioned adjacent to a lower end of the tube-type heat pipe 72 provides for the vaporization of the refrigerant within the heat pipe. Again, the support tube 70 would be positioned in the SOFC tube fabrication apparatus of FIG. 1 where elements No. 18 are shown and would be mounted to and supported by the tube supports 16 shown therein.

Referring to FIG. 5, there is shown yet another embodiment of the present invention which makes use of a thin hair-pin heater 84 positioned within and along the length of a SOFC support tube 80. Disposed between the hair-pin heater 84 and the support tube 80 is a gas purge conduit 82. The lower end of the conduit 82 comprises an oxidant purge gas inlet 86, while the lower end of the support tube 80 functions as an oxidant purge gas outlet 88. As in the other embodiments described above, the SOFC support tube 80 would be positioned upon and supported by the tube supports 16 of FIG. 1, with the hair-pin heater 84 and the gas purge conduit, which is preferably comprised of alumina, 82 extending down into and along the length of a respective tube support 16.

There has thus been shown a method and apparatus which makes use of an internal heater within a porous SOFC support tube and which is particularly adapted for the fabrication of SOFC tubes wherein interconnector and electrolyte layers are deposited on the outer surface of the support tube. The apparatus and method of the present invention offer the following advantages over the prior art:

(1) Each SOFC tube is individually heated to a precisely controllable temperature;
(2) The internal heater eliminates the temperature inhomogeneity across a furnace tube when heated externally;
(3) The internal heat pipe heater ensures a uniform temperature profile along the SOFC tube thus ensuring good oxide deposition kinetics;
(4) The internal heater concept makes use of a "cold wall" furnace enclosure and radiation shields which can be fabricated from readily available, conventional materials; and
(5) A large diameter ceramic tube is not necessary, thus eliminating one of the major problems in scale-up of the SOFC fabrication tube production quantities.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. Apparatus for coating an outer suface of a porous SOFC tube having open and closed ends with an interconnector layer and an electrolyte layer, said apparatus comprising:

first means for directing an oxidant gas into and along the length of the SOFC tube via the open end thereof;

heating means disposed within and along the length of the SOFC tube for uniformly heating the SOFC tube to a high temperature along its entire length; and second means for sequentially directing an interconnector gas and an electrolyte gas over an outer surface of the SOFC tube whereupon said interconnector and electrolyte gases become oxidized by said oxidant gas in forming the interconnector and electrolyte layers on the SOFC tube.

2. Apparatus in accordance with claim 1 wherein said first means includes a conduit disposed within and extending the length of the SOFC tube and having first and second open ends respectively disposed within and outside of the SOFC tube.

3. Apparatus in accordance with claim 2 wherein the second open end of said conduit forms an oxidant gas inlet.

4. Apparatus in accordance with claim 3 wherein said conduit is comprised of a thin layer of $Al_2O_3$.

5. Apparatus in accordance with claim 3 wherein the open end of the SOFC tube is an oxidant gas outlet.

6. Apparatus in accordance with claim 1 wherein said heating means includes an elongate, linear heat pipe.

7. Apparatus in accordance with claim 6 wherein said heat pipe includes an evacuated chamber having a refrigerant vapor therein.

8. Apparatus in accordance with claim 7 wherein said heat pipe further includes a capillary wick within the evacuated chamber thereof.

9. Apparatus in accordance with claim 6 further comprising a heat source coupled to said heat pipe.

10. Apparatus in accordance with claim 7 wherein said refrigerant vapor includes mercury.

11. Apparatus in accordance with claim 6 wherein said refrigerant vapor includes lithium.

12. Apparatus in accordance with claim 6 wherein said first means includes a conduit having first and second open ends respectively disposed within and without the SOFC tube, and wherein said heat pipe is disposed within and along the length of said conduit.

13. Apparatus in accordance with claim 12 wherein the second end of said conduit comprises an oxidant gas inlet and the open end of the SOFC tube comprises an oxidant gas outlet.

14. Apparatus in accordance with claim 1 wherein said heating means includes an elongated, linear hair-pin heater.

15. Apparatus in accordance with claim 14 wherein said first means includes a conduit having first and second open ends respectively disposed within and without the SOFC tube, and wherein said hair-pin heater is disposed within and along the length of said conduit.

16. Apparatus in accordance with claim 15 wherein the second end of said conduit comprises an oxidant gas inlet and the open end of the SOFC tube comprises an oxidant gas outlet.

17. Apparatus in accordance with claim 1 wherein said first means and said heating means are integrated in the form of a conduit having a hollow side wall defining an evacuated chamber and first and second open ends respectively disposed within and without the SOFC tube.

18. Apparatus in accordance with claim 17 wherein a refrigerant vapor is disposed within the evacuated chamber of said conduit.

19. Apparatus in accordance with claim 18 wherein a capillary wick is also disposed within the evacuated chamber of said conduit and extends along the length of said conduit.

20. Apparatus in accordance with claim 19 wherein said capillary wick has a generally cylindrical shape.

21. Apparatus in accordance with claim 19 further comprising a heat source coupled to the second end of said conduit.

22. Apparatus in accordance with claim 21 wherein the second end of said conduit comprises an oxidant gas inlet and the open end of the SOFC tube comprises an oxidant gas outlet.

23. Apparatus in accordance with claim 18 wherein said refrigerant vapor includes mercury.

24. Apparatus in accordance with claim 18 wherein said refrigerant vapor includes lithium.

* * * * *